(12) United States Patent
Fukushima et al.

(10) Patent No.: US 7,189,082 B2
(45) Date of Patent: Mar. 13, 2007

(54) ELECTRICAL CONNECTION BOX

(75) Inventors: Hayato Fukushima, Mie (JP); Shigeki Yamane, Mie (JP); Tadashi Tomikawa, Mie (JP); Shinji Kawakita, Mie (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/102,801

(22) Filed: Apr. 11, 2005

(65) Prior Publication Data

US 2005/0227542 A1    Oct. 13, 2005

(30) Foreign Application Priority Data

Apr. 12, 2004    (JP) ............................ P2004-116989

(51) Int. Cl.
*H05K 1/00* (2006.01)
(52) U.S. Cl. ............... 439/76.2; 439/206; 439/949; 174/50; 174/58; 174/60
(58) Field of Classification Search ............... 439/76.2, 439/206, 205, 949; 174/50, 58, 60
See application file for complete search history.

(56) References Cited

U.S. PATENT DOCUMENTS

| | | | | |
|---|---|---|---|---|
| 5,876,243 A | * | 3/1999 | Sangawa | .................... 439/519 |
| 5,941,719 A | * | 8/1999 | Hayakawa | ................... 439/206 |
| 6,319,057 B2 | * | 11/2001 | Sekido et al. | ............... 439/519 |
| 6,428,331 B1 | * | 8/2002 | Yamakawa et al. | ........ 439/76.2 |
| 6,443,748 B1 | * | 9/2002 | Yuasa | ......................... 439/205 |
| 6,787,698 B2 | * | 9/2004 | Higuchi et al. | ............... 174/50 |
| 6,796,809 B2 | * | 9/2004 | Kakuta et al. | ............. 439/76.2 |
| 2003/0219998 A1 | | 11/2003 | Kakuta et al. | |

* cited by examiner

*Primary Examiner*—Gary F. Paumen
(74) *Attorney, Agent, or Firm*—Oliff & Berridge, PLC

(57) ABSTRACT

An electrical connection box is to be attached to an attachment objective member. The electrical connection box includes: a circuit housing that accommodates a circuit substrate; a fuse box that detachably accommodates a fuse element, the fuse box being provided at an upper portion of the circuit housing in a state where the electrical connection box being attached to the attachment objective member; a plurality of bus bars that connect the circuit substrate and the fuse element; and a water-discharge channel that discharges water flowed into the fuse box to outside of the electrical connection box, the water-discharge channel being provided at a lower part of the bus bars in a state where the electrical connection box is attached to the attachment objective member, and at a position between the circuit housing and the fuse box.

12 Claims, 9 Drawing Sheets

ELECTRICAL CONNECTION BOX

BACKGROUND OF THE INVENTION

1. Field of the Invention

The present invention relates to an electrical connection box mounted mainly in an automobile.

2. Description of the Related Art

An electrical connection box mounted in an automobile has been so far installed in an engine compartment and others, depending on the case. Thus, measures have been taken for preventing a short circuit between circuit substrates or between bus bars, due to immersion of water used in washing an automobile (See JP-A-2003-348732).

In the conventional electrical connection box, a fixing part for connecting an external connector is integrally provided on an upper face of a frame for accommodating the circuit substrate. The fixing part is provided with a terminal-accommodating hole, which penetrates vertically, in which a terminal having an external connector and a terminal (bus bar) for connecting the circuit substrate part accommodated. Therefore, there is a possibility that water coming from the terminal-accommodating hole may enter into the circuit substrate inside the electrical connection box through the bus bar.

Thus, on the channel from the fixing part to the circuit substrate, another component is fitted into an outer circumference of the bus bar hermetically, thereby changing the route of water flowing through the bus bar to protect the circuit substrate from water damage.

SUMMARY OF THE INVENTION

For example, there is a case where a fuse box (separate body) is provided on the upper part of the casing. In this case, since bus bars are wired from the fuse box to the electrical connection box, raindrops entered into the fuse box flow through the bus bar from the fuse box to the casing. At this time, when raindrops remain on the upper face of the casing, there is a possibility that a short circuit may occur between bus bars, which requires for improvement.

The present invention has been completed in view of the above circumstances, and one of objects thereof is to prevent a short circuit between bus bars.

According to one aspect of the present invention, there is provided an electric connection box to be attached to an attachment objective member, the electrical connection box including: a circuit housing that accommodates a circuit substrate; a fuse box that detachably accommodates a fuse element, the fuse box being provided at an upper portion of the circuit housing in a state where the electrical connection box being attached to the attachment objective member; a plurality of bus bars that connect the circuit substrate and the fuse element; and a water-discharge channel that discharges water flowed into the fuse box to outside of the electrical connection box, the water-discharge channel being provided at a lower part of the bus bars in a state where the electrical connection box is attached to the attachment objective member, and at a position between the circuit housing and the fuse box.

BRIEF DESCRIPTION OF THE DRAWINGS

The objects and advantages of the present invention will become more apparent by describing preferred embodiments thereof in detail with reference to the accompanying drawings, wherein.

DETAILED DESCRIPTION OF THE PREFERRED EMBODIMENTS

An embodiment of the present invention will be explained with reference to FIGS. 1–9.

Figure 1:
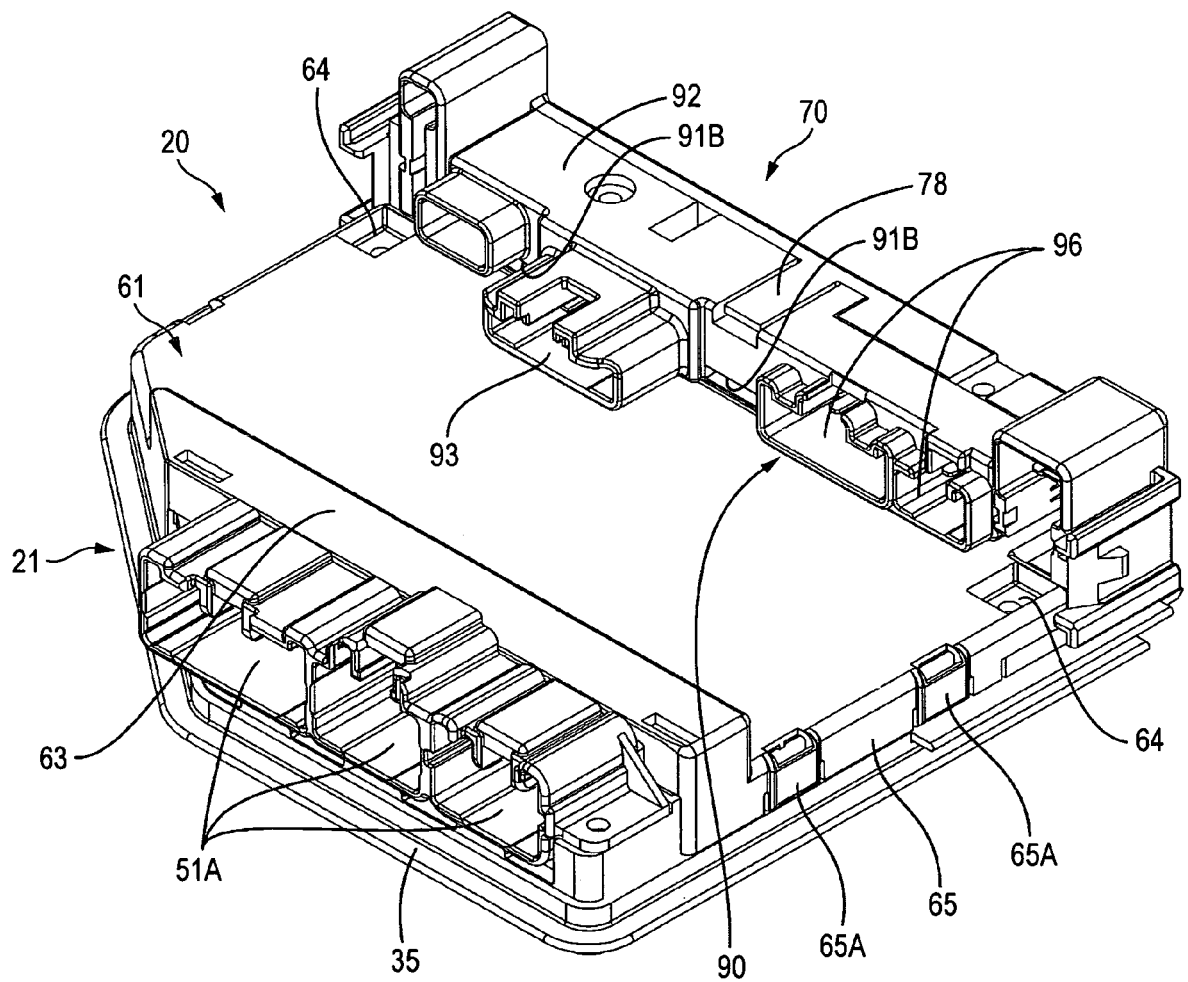
FIG. 1 is a perspective view showing an electrical connection box of one embodiment in the present invention.

A member 20 shown in FIG. 1 is an electrical connection box used in an automobile and provided between a power source such as a battery and an electrical load (electrical components such as lamps and audio products), by which electric power supplied from the power source is distributed and supplied to individual electrical components and also control is performed such as switching of the power supply. The electrical connection box 20 is formed mainly with the body of the connection box 21 for accommodating therein the circuit component 31 in which electrical components 32 such as switching elements being mounted on the circuit substrate 33, the lower connector 51, the fuse box 70, the upper connector 90 (corresponding to the connector housing of the present invention), and it is disposed, for example, inside an engine compartment vertically.

In the following description, the vertical direction is based on the assembly or the direction illustrated in FIG. 3, and the longitudinal direction is based on the direction illustrated in FIG. 1.

The body of the connection box 21 is described with reference to FIG. 2.

The numeral 35 given in the this figure is a frame, which is made of an insulating material, for example, a synthetic resin, and framed so as to surround the outer circumference of the circuit component 31 and accommodate the circuit component 31 therein from above. Both the right and left edges of the frame 35 are provided with the fixing inner wall 37 erected above the figure, and a pair of lock pieces 37A corresponding to the covers 61 to be described later are provided on an outer wall of each inner wall 37.

Figure 2:
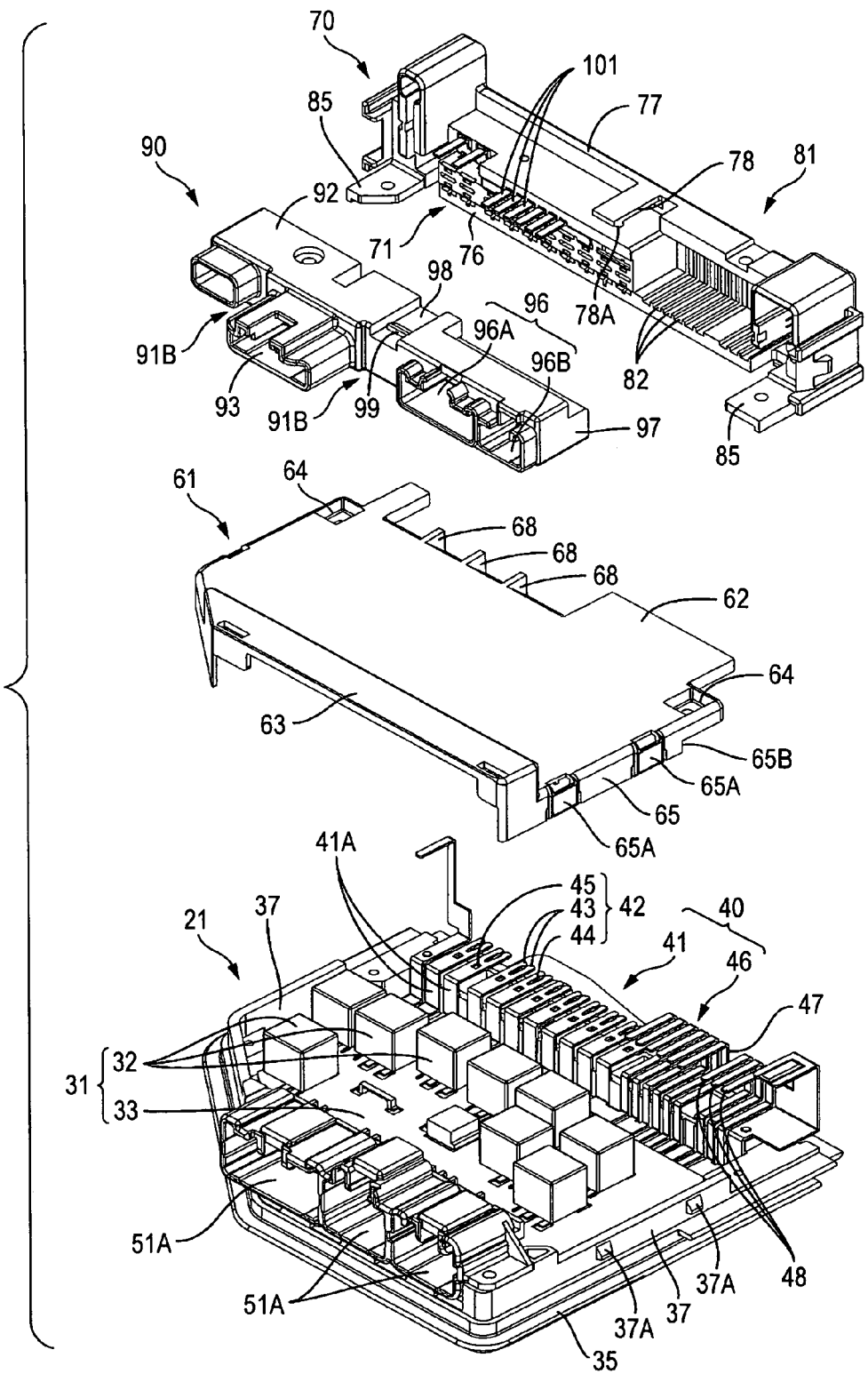
FIG. 2 is an exploded perspective view showing the electrical connection box.

A radiator plate 39 is attached on the opening edge on the bottom of the frame 35 (lower face in FIG. 2).

Figure 4:
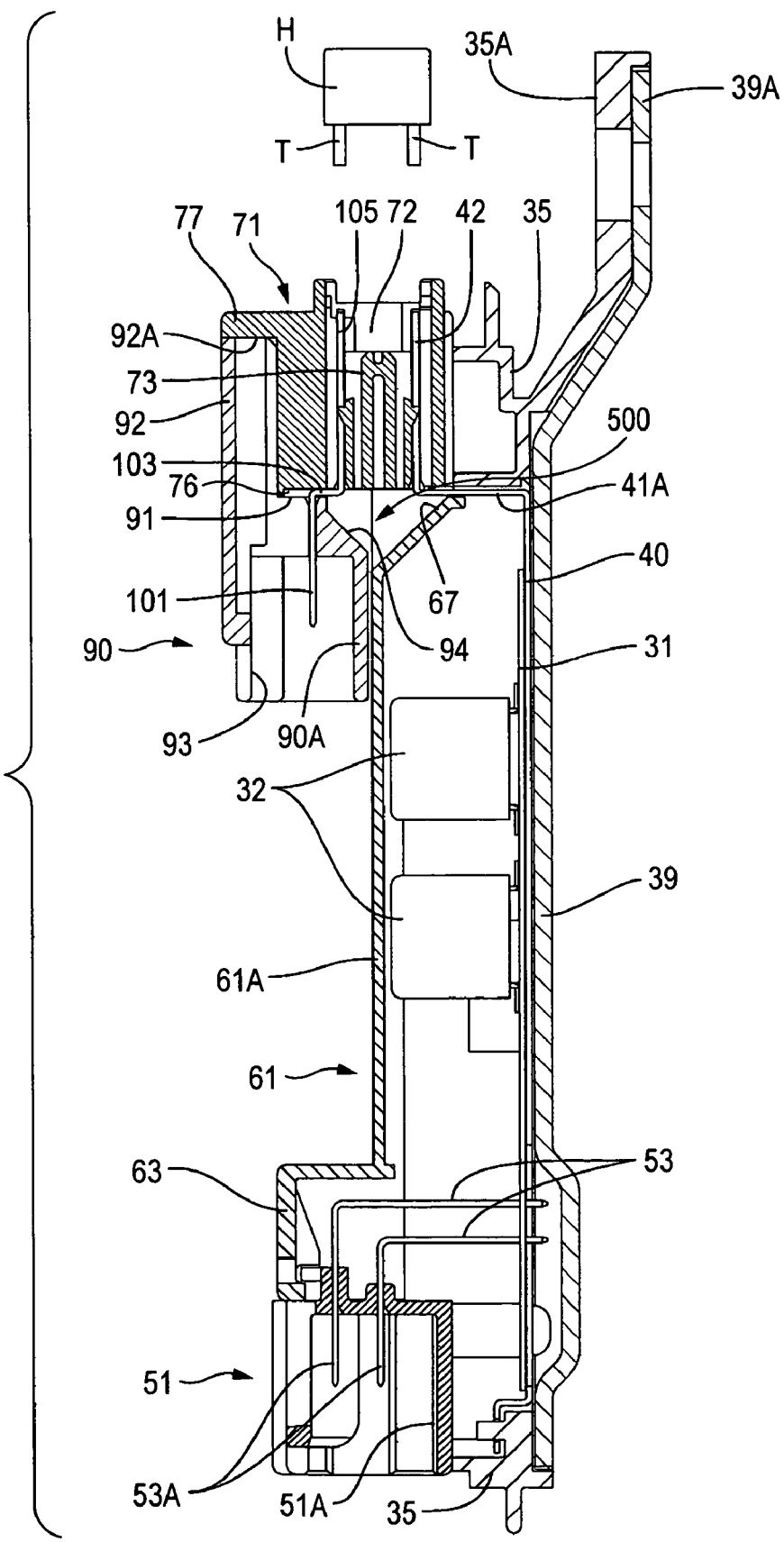
FIG. 4 is a sectional view of the electrical connection box showing a state of attachment of the upper connector.

The radiator plate 39 is made of a metal and formed in a dimension sufficient to cover an opening on the bottom of the frame 35 and designed to close a whole part of the opening on the bottom, when attached. Further, the radiator plate 39 and the frame 35 are provided respectively with the fixing parts 35A and 39A projecting outside the circuit component 31. These fixing parts 35A and 39A are provided with a screw hole and, as shown in FIG. 4, fastened against the wall of an engine compartment, with both the fixing parts 35A and 39A overlapped, by which the electrical connection box 20 is mounted as a whole.

Figure 3:
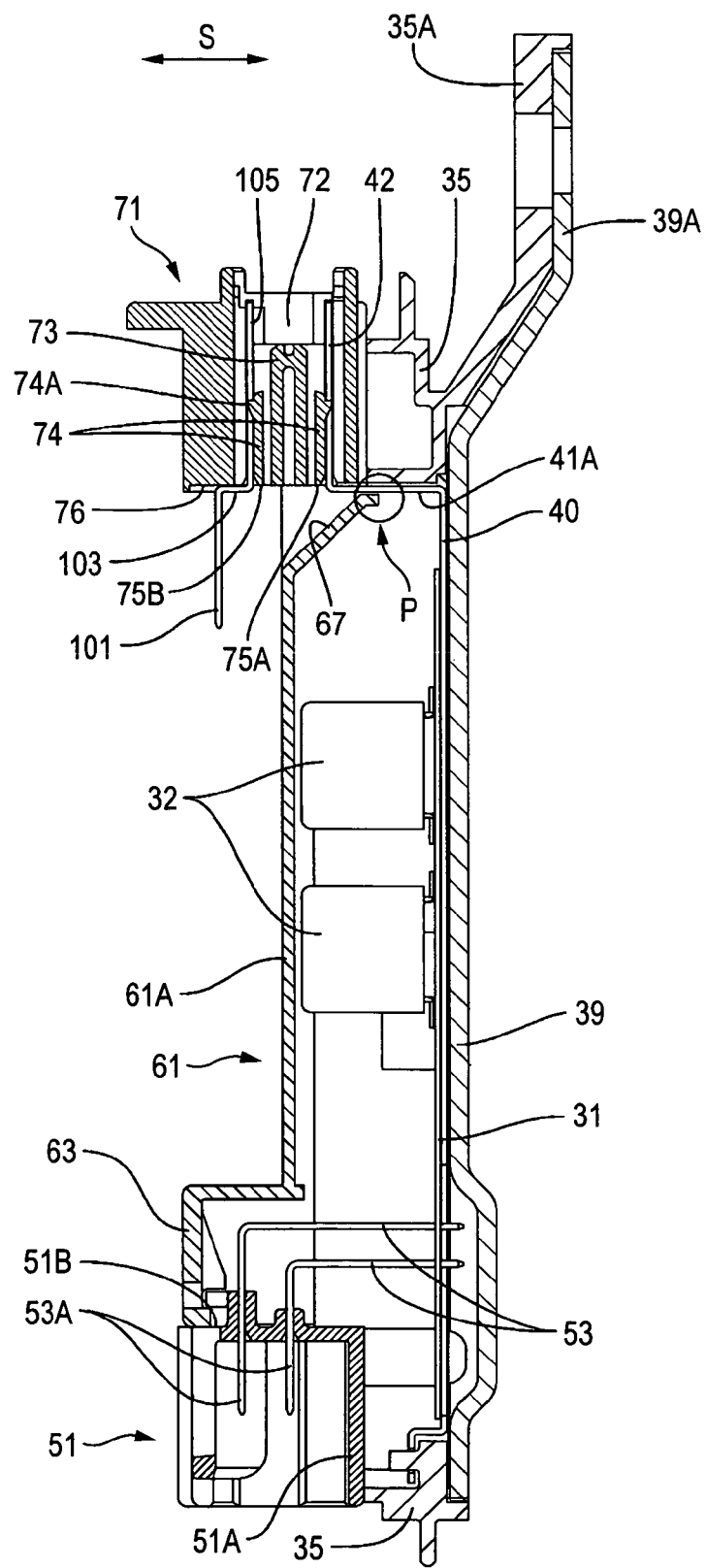
FIG. 3 is a sectional view of the electrical connection box (showing a state before the upper connector is attached)

As shown in FIG. 3, a substrate bus bar 40 is arranged, which forms an electrically-conductive channel located between the circuit substrate 33 and the radiator plate 39 to distribute a power source. The substrate bus bar 40 is made of a metal plate. An insulating adhesive agent is applied respectively on whole surfaces between the substrate bus bar 40 and circuit substrate 33 and also between the substrate bus bar 40 and the radiator plate 39, by which each member is adhesively fixed and electrically insulated. An electrical connection with the electrically-conductive channel on the substrate bus bar 40 and the circuit substrate 33 is made, for example, by soldering between a through-hole provided on a jumper wire or circuit substrate 33 and the substrate bus bar 41.

As shown in FIG. 2, one end of the substrate bus bar 40 is taken out from the upper edge of the circuit substrate 33 (edge on the right back side in FIG. 2) in line with the circuit substrate 33. The substrate bus bars 41 arranged in a range from the left corner of the circuit substrate 33 to the slightly right part from the center are designed to be slightly thicker in plate width than the substrate bus bars 46 arranged on the right corner. The substrate bus bar 41 is bent in an L-lettered shape, with the front end pointed to the right backside as shown in FIG. 2 (the side on which the fuse box 70 to be described later is attached). The front end of the substrate bus bar 41 reaches to the fuse-terminal connecting part 42, forming a pair of holding pieces 43 which are faced to each other. The groove 44 for accommodating a fuse terminal T is provided between these holding pieces, and when the fuse terminal T is inserted into the groove, the holding pieces 43 are resiliently installed with respect to the fuse terminal T.

In contrast, the substrate bus bar 46 is bent in a U-lettered shape, so that the front end is pointed in the direction opposite the fuse-terminal connecting part 42. The front end of the substrate bus bar 46 is the tab terminal 48 and inserted into the second hood part 96 formed in the upper connector 90 to be described later. A part of the substrate bus bar 46 bent in a U-lettered shape is to be used as a folded part 47.

Further, a lower connector 51 is attached to the lower edge of the circuit substrate 33. The lower connector 51 is made of a synthetic resin, and in this embodiment three lower connectors are provided in a width direction. The lower connector 51 is provided with a cylindrical hood part 51A to be fitted into a mating connector. As shown in FIG. 3, a terminal fitting 53 bent in an L-lettered shape is fixed by a soldering process to the lower edge of the circuit substrate 33, and a tab 53A of the terminal fitting 53 penetrates through the back wall of the lower connector 51 and projects inside the hood part 51A.

Next, a cover 61 is described. The cover 61 is made of a synthetic resin and formed in a dimension sufficient to cover the front of the circuit substrate 33. A tab supporting piece 62 is provided at the right back corner as shown in FIG. 2. The tab supporting piece 62 enters into the folded part 47, together with a tab supporting shoulder 97 of the upper connector 90 to be described later, and fitted therein without any clearance, when the cover 61 is attached to the frame 35.

The lower edge 63 of the cover 61 extends out over the entire width in the direction opposite the circuit substrate 33 (above in FIG. 2). As shown in FIG. 3, in this embodiment, the height of the cover 61 is designed with reference to the mounting components 32 such as relays. However, since the terminal fitting 53 to be jointed to the lower connector 51 is placed at a site higher than other mounting components 32, in the cover 61, a part opposed to the terminal fitting 53 is allowed to extend out, thereby avoiding interference of the cover 61 with the terminal fitting 53 at this site.

An outer wall 65 is provided as a projection toward the frame 35 at a site opposed to an inner wall 37 of the frame 35, which is a side edge of the cover 61, and an outer wall 65 is provided with the lock supporting part 65A which can be locked by the lock piece 37A.

When the cover 61 is fitted to the frame 35, these outer walls 65 are allocated so as to surround the inner wall 37 as shown in FIG. 3, the upper edge of the cover 61 reaches the bent-up part of respective substrate bus bars 41 (hereinafter, referred to as bent part 41A) and the lower edge of the cover 61 abuts against the back face 51B of the lower connector 51. Then, in a state of such attachment, the lock piece 37A is locked by the lock supporting part 65A, thereby holding the cover 61 so as not to prevent falling off from the frame 35.

In the above state, the fuse-terminal connecting part 42 is kept exposed on the body of the connection box 21 and pointed upward as shown in FIG. 3.

A plurality of seats 64 for fastening the cover 61 to the frame 35 with screws, together with the fuse box 70 to be described later, are provided on the upper edge of the cover 61 or on both right and left ends of the cover. The structure for fastening the fuse box 70 is also described. Of the outer walls 65, an outer wall around the seats 64 has a lower edge part which is partitioned, and a shoulder 65B is provided between the outer wall and other outer wall 65. The shoulder 65B is positioned at the same height with the plate thickness of a fixing edge 85 to be formed on the fuse box 70, and a fixing edge 85 is to be fitted into the shoulder 65B. Then, the fixing part 85 and the seat 64 are overlapped and fastened with a screw, by which the cover 61 and the fuse box 70 are fixed to the frame 35. The cover 61 and the frame 35 correspond to the water-proof casing of the present invention.

The fuse box 70 is made of a synthetic resin and forms a horizontally-long block shape, extending toward a width direction of the circuit substrate 33. In the fuse box 70, a part from the left corner to the slightly right from the center as shown in FIG. 2 is a first accommodating part 71, and a right half of the remaining part is a second accommodating part 81 in which the folded part 47 of the substrate bus bar 46 is accommodated.

The second accommodating part 81 has an opening on the circuit substrate 33 (lower side in FIG. 2) and collectively accommodates a whole folded part 47 of the substrate bus bar 46 from the opening. A supporting groove 82 is provided on three inner walls constituting the second accommodating part 81 at a site opposed to each substrate bus bar 46. The supporting groove 82 is formed so that the width is the same as that of the substrate bus bar 46.

Next, the first accommodating part 71 is described.

An intrusion adjusting wall 77 extending above, as illustrated in the figure, is formed over the entire width of the first accommodating part 71 on the one side face of the first accommodating part 71 (upper face in FIG. 2), and an elastic lock arm 78 extending toward the cover 61 in a cantilever form is provided on the right side edge. A claw 78A projecting inward is provided at the front end of the elastic lock arm 78.

Figure 7:
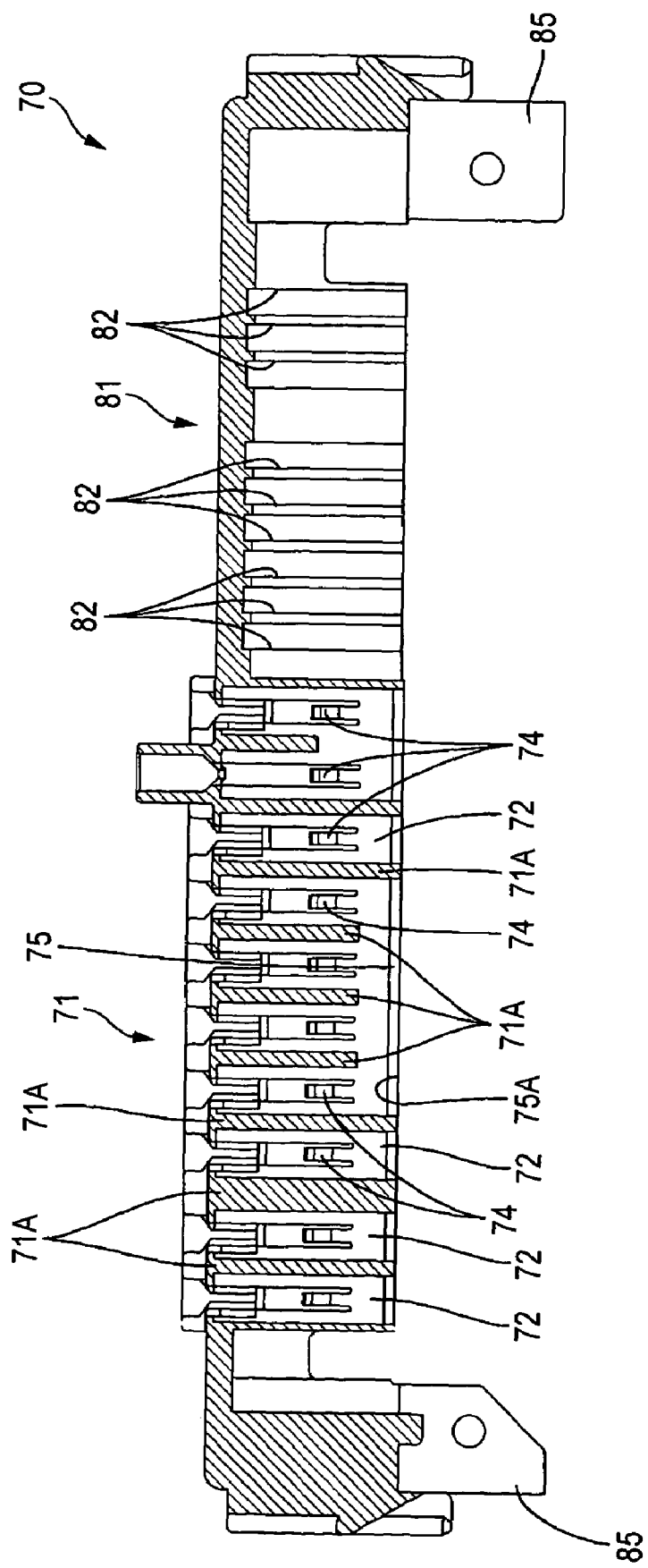
FIG. 7 shows a horizontal cross section of the fuse box.

As shown in FIG. 3, the first accommodating part 71 is opened above, in which plural partitioning walls 71A are provided in the width direction (refer to FIG. 7). Each of the thus partitioned compartments is used as a fuse compartment 72. A bottom wall 75 of each fuse compartment 72 is provided with a pair of terminal insertion holes 75A and 75B as in the direction of S, as shown in FIG. 3. Stoppers 74 are provided on both sides of the portioning wall 73 between these terminal insertion holes 75A and 75B. The stopper 74 extends above, as shown in the figure, in a cantilever form, and the front end is provided with the lock claw 74A.

Of these terminal insertion holes, the fuse-terminal connecting part 42 of the substrate bus bar 41 is inserted through the right terminal insertion hole 75A, as shown in FIG. 3. A lock hole 45 which can be locked by the lock claw 74A of the stopper 74 is provided on the fuse-terminal connecting part 42, and the lock claw 74A is locked by the lock hole 45, thereby stopping the fuse-terminal connecting part 42 when the fuse-terminal connecting part 42 is inserted into a normal position, as shown in FIG. 3.

Figure 8:
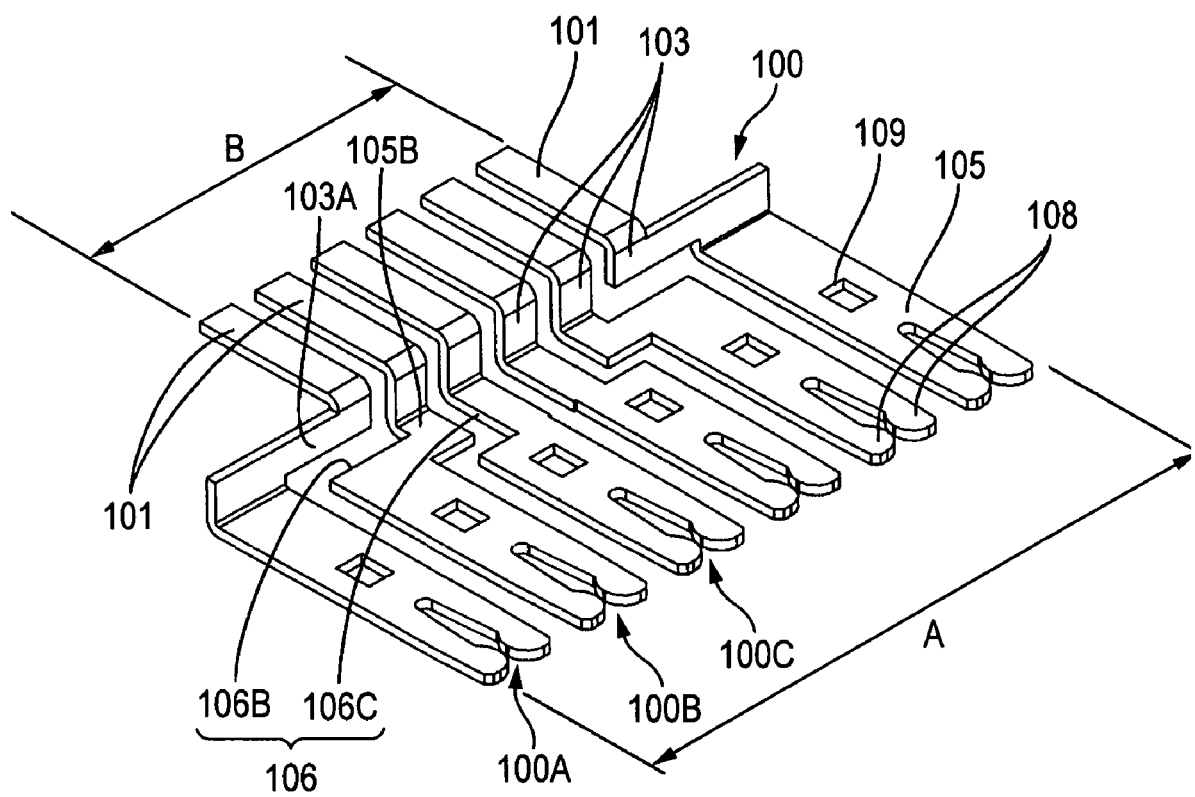
FIG. 8 is a perspective view of the terminal fitting.

The fuse-terminal connecting part 105 of a connector bus bar 100 is inserted into the left terminal insertion hole 75B. As shown in FIG. 3, the connector bus bar 100 is bent in a crank form. To be more specific, as shown in FIG. 8, the connector bus bars 100 are provided in a form connected back and forth through the joining part 103 between the tab 101 and the fuse-terminal connecting part 105. Further, a plurality of the connector bus bars 100 are arranged in a width direction in line, and in such a state the entire width of the fuse-terminal connecting part 105 (A dimension shown in FIG. 8) is made narrower than the entire width of the tab 101 (B dimension shown in FIG. 8).

As explained above, in order that the width is allowed to change and the tab 101 is connected with the fuse-terminal connecting part 105, the joining part 103A is extended inward (back side in FIG. 8) at the outermost connector bus bar 100A and a traverse extension part 105B is provided on the bottom of the fuse-terminal connecting part 105 at the connector bus bar 100 B adjacent thereto. Therefore, the fuse-terminal connecting part 105 and the tab 101 are connected at a deviated position in relation to the direction in which connector bus bars 100 are arranged.

In addition, an escaping groove 106 is provided at a site opposed to the joining part 103A or to the traverse extension part 10B on the bottom of each fuse-terminal connecting part 105 (excluding the outside connector bus bar 100A) so as not to interfere with the fuse-terminal connecting part 105 of connector bus bar 100 adjacent to the extended joining part 103A or to the traverse extension part 105B. Therefore, in a state where all the connector bus bars 100 are arranged, the traverse extension part 105B and the joining part 103A enter respectively in the escape groove 106C of the connector bus bar 100C and at the escape groove 106B of the connector bus bar 100B, thereby preventing interference between the connector bus bars 100 adjacent to each other.

The fuse-terminal connecting part 105 of the connector bus bar 100 is provided with a pair of holding pieces 108 at the front end, as the fuse-terminal connecting part 42 of the substrate bus bar 41, and is also provided with the lock hole 109 corresponding to the lock claw 74A on the lower side.

A fuse H having a pair of fuse terminals T is detachably accommodated into each fuse compartment 72 from above, as shown in the figure. In a state of actual attachment, one fuse terminal T is connected with the connector bus bar 100 and another fuse terminal T is connected with the substrate bus bar 41, by which the fuse H is melted by heat and cut off, when over-current runs through the bus bar 41 or 100, thereby protecting an electrical load connected to the circuit component 31 or the upper connector 90. Further, as shown in FIG. 3, in a state where the fuse box 70 is assembled to the frame 35, the left half of the fuse box 70 projects laterally to the body of the connection box 21, and the upper connector 90 to be described later is assembled at a lower part of the projected part along the wall 61A of the cover 61 and from below as shown in the figure.

The upper connector 90 is in a horizontally-long shape, extending along the width direction of the fuse box 70. The first hood part 93 is formed at a site opposed to the first accommodating part 71 and the second hood part 96 is formed at a site opposed to the second accommodating part 81. Further, in this embodiment, the second hood part 96 is formed with two divided hoods 96A and 96B. These two hood parts 93 and 96 are both in a cylindrical shape and open to the same direction as the hood part 51A of the lower connector 51, each of which is to be fitted into the respective counterpart connectors (not illustrated).

Also as shown in FIG. 2, the illustrated back face of the second hood part 96 projects toward the second accommodating part 81 of the fuse box, which is a tab-supporting shoulder 97. The tab supporting shoulder 97 is able to enter into the second accommodating part 81 and, in a state of assembly, is supported in a state where the folded part 47 of the substrate bus bar 46 is held against the wall of the second accommodating part 81.

In the upper connector 90, a locking groove 98 is provided in a concave form between the first hood part 93 and the second hood part 96 and facing to the elastic lock arm 78 of the fuse box 70. The locking groove 98 is provided along the extending direction of the elastic lock arm 78 and penetrates horizontally. It is designed to accommodate the elastic lock arm 78 inside the groove from the front in association with the movement of attaching the upper connector 90. A lock projected part 99 is formed on the bottom, which can be locked by the claw 78A of the elastic lock arm 78.

Figure 6:
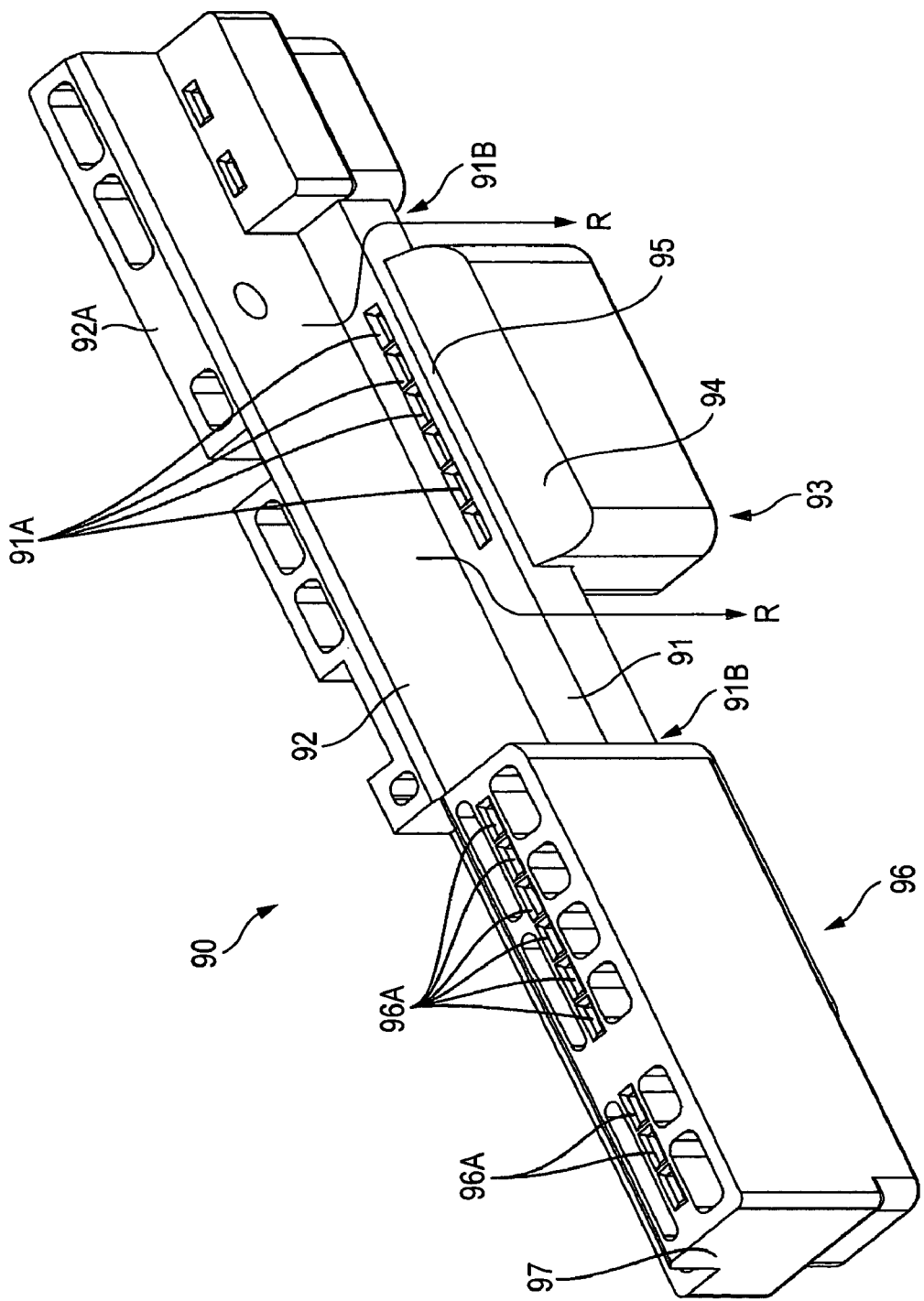
FIG. 6 is a perspective view of the upper connector, when viewed behind.

FIG. 6 is a perspective view showing the upper connector 90 from the back or side face facing to the side of the cover 61. The numeral 91 given in the figure denotes an opposite part and opposed to the lower face 76 on the bottom wall 75 of the first accommodating part 71 when the upper connector 90 is aligned directly opposite the fuse box 70. For the opposite part 91, the central part is provided with the first accommodating hole 91A provided to the first hood part 93, whereas the upper wall of the second hood part 96 on the left side of the opposite part 91 is provided with the second accommodating hole 96A. Of these holes, the first accommodating hole 91A is inserted by the tab 101 of the connector bus bar 100 and the second accommodating hole 96A is inserted by the tab 48 of the substrate bus bar 46.

One side edge of the opposite part 91 is provided with a guide wall 92 erected above the figure and provided to the side edge of the second hood part 96. The guide wall 92 is designed to guide a motion of assembling the upper connector 90 to the fuse box 70 by sliding on the side of the fuse box 70 in the course of assembly motion.

The front end of the elastic lock arm 78 is fitted into the locking groove 98 and the upper connector 90 is pushed into the fuse box 70, by which the tab 101 of the connector bus bar 100 enters into the first hood part 93 through the first accommodating hole 91A, and the tab 48 of the substrate bus bar 46 enters into the second hood part 96 through the second accommodating hole 96A. Then, the lock projected part 99 passes through the claw 78A of the elastic lock arm 78, thereby causing the elastic lock arm 78 to deflect flexibly.

Thereafter, the elastic lock arm 78 comes back when the lock projected part 99 passes through the claw 78A, by which the claw 78A is positioned in opposition to the lock projected part 99, thereby keeping the upper connector 90 held by the fuse box 70 so as not to fall off. In a state of such attachment, the end face 92A of the guide wall 92 is pushed against the intrusion adjusting wall 77 of the fuse box 70, by which an additional intrusion is adjusted.

In this embodiment, the substrate bus bar 41 and the connector bus bar 100 are taken out from the lower face 76 of the fuse box 70, then, bent in a crank shape and drawn into the cover 61 or the upper connector 90, following the wiring channel along the lower face 76 (refer to FIG. 4). Thus, once raindrops enter into the fuse chamber 72, such raindrops soon reach at a bent part of the bus bars 41 and 100 through the substrate bus bar 41 or the connector bus bar 100. Raindrops will easily remain at the part, and there is a problem of a short circuit between substrate bus bars 41 or connector bus bars 100 which are adjacent to each other. In this embodiment, therefore, a water-discharge channel (water-discharge channel 500) is provided between the bent part 41A of the substrate bus bar 41 and the upper face of the cover 61 as well as between the joining part 103 of the connector bus bar 100 and the opposite face 91 of the upper connector 90, thereby increasing water-discharge performance.

Figure 5:
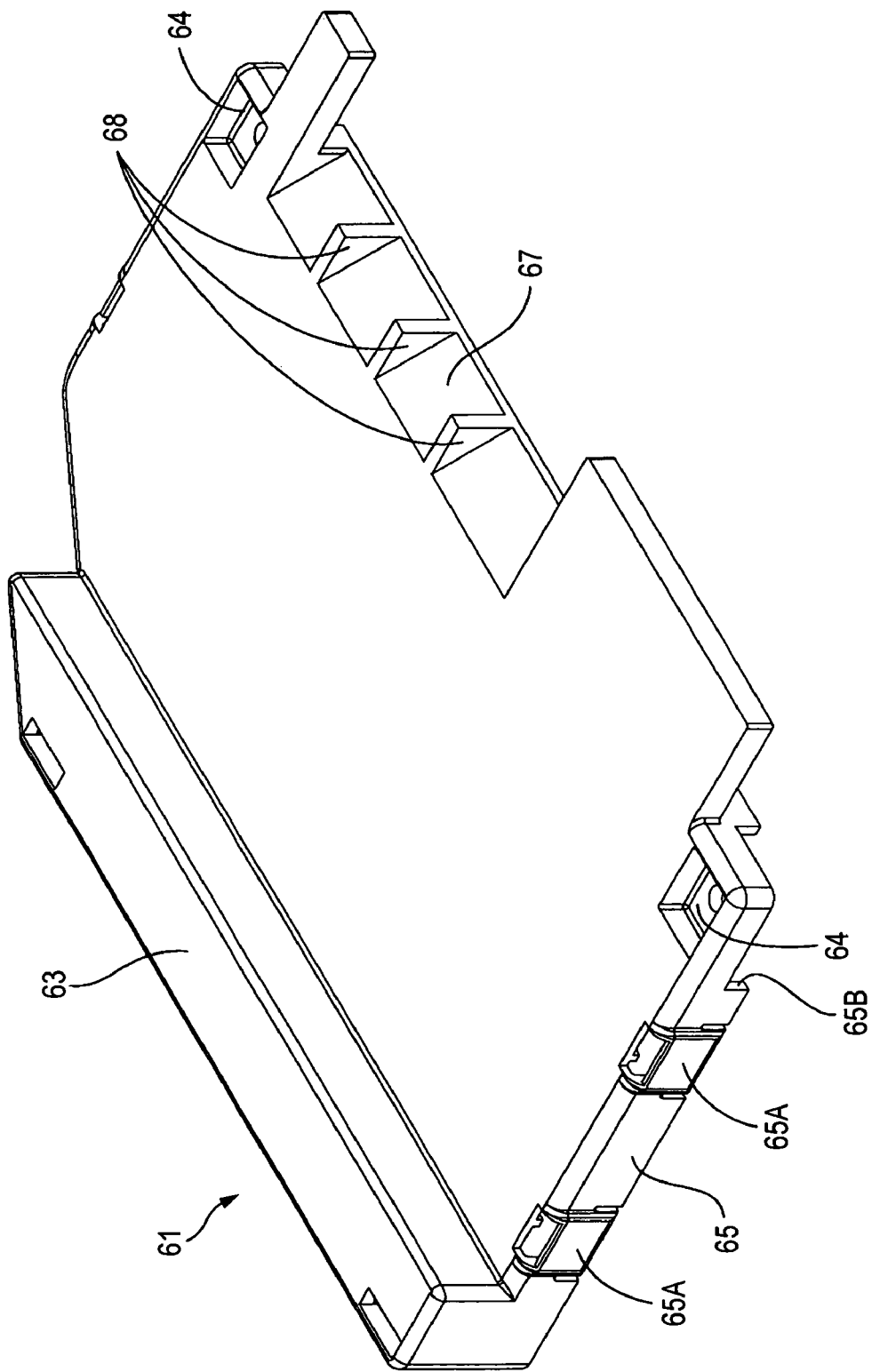
FIG. 5 is a perspective view of the cover.

To be more specific, a cover-side water-discharge inclined face 67 is provided on the cover 61, as shown in FIG. 5. The cover-side water-discharge inclined face 67 is positioned in opposition to the first accommodating part 71 of the fuse box 70 and similar in width to the first accommodating part 71. The water-discharge inclined face 67 starts from the front end of the frame 35 (P part illustrated in FIG. 3 from which the substrate bus bar 41 is drawn from the inside of the frame 35), declining toward the upper connector 90 at about a 45 degree gradient, with the end reaching the wall 61A of the cover 61.

In contrast, a connector-side water-discharge inclined face 94 is formed over the entire width of the upper part of the first hood part 93, as shown in FIG. 6. The connector-side water-discharge inclined face 94 is provided with the shoulder 95 between the opposite part 91 and the face 94. Therefore, as shown in FIG. 4, the inclined starting edge retracts down below as compared with the lower face 76 of the fuse box 70. The water-discharge inclined face 94 is declined downward therefrom to the cover 61 at about a 45 degree gradient, with the edge reaching the back face 90A of the upper connector 90. These two water-discharge inclined faces 67 and 94 form a mutually opposite and V-shaped water-discharge groove in a state of attachment, or a space for discharging water. Thus, raindrops coming from the substrate bus bar 41 and the connector bus bar 100 are discharged downward through the respective water-discharge inclined faces 67 and 94, or outside wiring channels of the substrate bus bar 41 and the connector bus bar 100.

Further, the water-discharge inclined face 67 of the cover 61 is provided with three supporting pieces 68 (corresponding to the supporting plate of the present invention) in the width direction. The supporting piece 68 is shaped in a plate form along the water-discharge inclined face 67 in the inclined direction (triangle in this embodiment) and designed to support from beneath the fuse box 70, with the upper end face in contact with the lower face 76 of the fuse box 70, at the time of attachment. For example, where the fuse H is exchanged, a downward pressing force acts on the fuse box 70, and the above structure makes it possible to firmly support the fuse box 70 by the supporting piece 68.

Further, as shown in FIG. 6, the connector-side water-discharge inclined face 94 is depressed from both the right and left sides at the back, as shown in the figure. That is, both sides of the connector-side water-discharge inclined face 94 in the upper connector 90 are cut out to form recessed portions that spaces apart from the wall 61A of the cover 61. The recessed portions are connected to the opposite part 91 to form an auxiliary water-discharge channel 91B. The auxiliary water-discharge channel 91B is for discharging raindrops R flowing to the sides of the opposite part 91, of those flowing through the connector bus bars 100 (see FIG. 6).

Next, the advantages of the embodiment will be described.

The fuse H is exchanged, with the hood opened. If the fuse is exchanged, for example, when it rains, raindrops may enter into the fuse compartment 72 of the fuse box 70. Raindrops entered into the fuse compartment 72 seep out on the lower side 76 of the fuse box 70 through insertion holes 75A and 75B provided in the fuse compartment 72. Thereafter, such raindrops on the substrate bus bar 41 gradually seep out on the cover 61 along the bent part 41A of the bus bar 41, and those on the connector bus bar 100 seep out on the upper connector 90 along the joining part 103 of the bus bar 100. The raindrops soon reach a starting edge of the cover-side water-discharge inclined face 67 or that of the connector-side water-discharge inclined face 94. Thereafter, the raindrops are discharged downward, namely, outside the wiring channel of the substrate bus bar 41 or of the connector bus bar 100 along the inclined face of the water-discharge inclined face 67 or 94.

In a case where the water-discharge inclined faces 67 and 94 are not provided, raindrops remain over the entire upper edge of the cover 61 and on the opposite part 91 of the upper connector 90. Therefore, raindrops remain on the lower part of the wiring channel of the bus bars 41 or 100 may cause a short circuit between the substrate bus bars 41 or between the connector bus bars 100. However, as explained above, the lower part is provided with the water-discharge inclined faces 67 and 94, by which raindrops flowing through the bus bars 41 and 100 do not remain around the wiring channel of the bus bars 41 or 100 but are discharged outside the wiring channel, thereby preventing a short circuit between the substrate bus bars 41 or between the connector bus bars 100 resulting from raindrops being at the part. In addition, the V-shaped discharge groove formed by the water-discharge inclined faces 67 and 94 is greater in volume and therefore more excellent in discharging water.

The present invention is not restricted to the embodiment described with reference to the above description and figures but includes, for example, the following embodiments in the technical field of the invention. In addition, the invention can be executed in various modifications other than examples shown below, without deviating from the scope and object of the invention.

Figure 9:
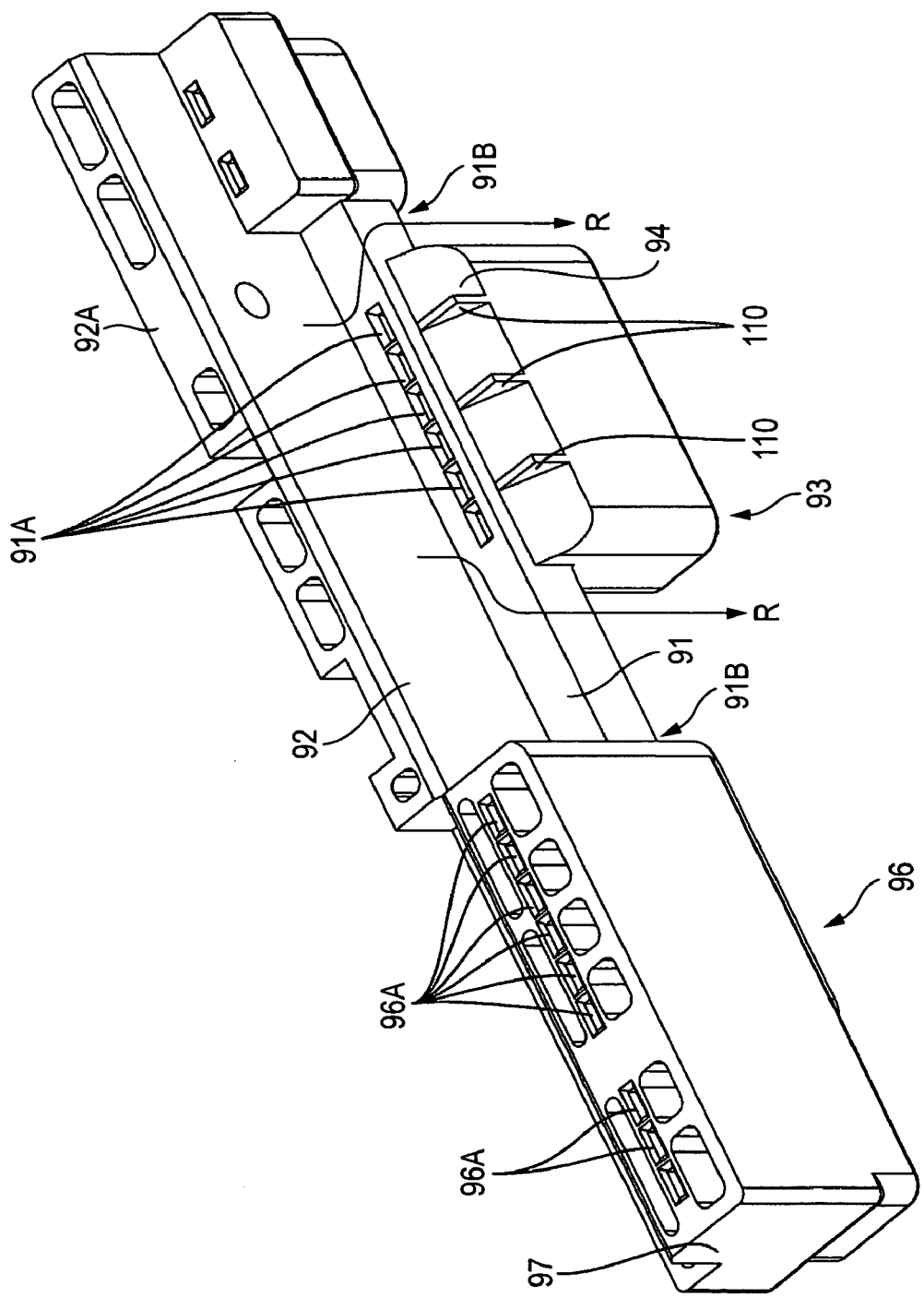
FIG. 9 is a view showing another embodiment (perspective view of the upper connector when viewed behind).

(1) In the embodiment described above, the supporting piece 68 is provided only on the cover 61. However, as shown in FIG. 9, the supporting piece 110 may be provided on the water-discharge inclined face 94 of the upper connector 90.

(2) In the embodiment described above, the upper connector 90 is provided separated from the frame 35. However, the upper connector 90 and the frame 35 may be provided in an integrated form.

(3) In the embodiment described above, no water repellent finishing was performed to the water-discharge inclined face 67 or 94. However, water repellent finishing may be performed to the faces so as to increase water-discharge performance.

As described with reference to the embodiments, even if water which has entered into the fuse box enters from the fuse box to the circuit housing through the bus bar, the water-discharge channel provided below the wiring channel of the bus bar from the fuse box to the circuit housing is able to prevent a short circuit that may be caused by water between the bus bars adjacent to each other on the way to the wiring channel.

The water-discharge channel is formed with the water-discharge inclined face, thereby increasing water-discharge performance.

The fuse box is more stably supported due to the use of the supporting part.

The supporting part is shaped in a plate form along the water-discharge inclined face in the inclined direction, so that it will not interfere in the discharge of water.

Water such as raindrops remaining between the preventive casing and the fuse box can be discharged, thereby preventing a short circuit which may occur between the bus bars at the site.

Water such as raindrops remaining between the connector housing and the fuse box can be discharged, thereby preventing a short circuit which may occur between the bus bars at the site.

Since the fitting part is opened downward, raindrops discharged through the water-discharge channel will not enter into the part.

A V-shaped groove is formed by the water-discharge inclined face of the preventive casing and that of the connector housing, thereby increasing water-discharge performance.

Although the present invention has been shown and described with reference to specific embodiments, various changes and modifications will be apparent to those skilled in the art from the teachings herein. Such changes and modifications as are obvious are deemed to come within the spirit, scope and contemplation of the invention as defined in the appended claims.

What is claimed is:

1. An electrical connection box to be attached to an attachment objective member, the electrical connection box comprising:
   a circuit housing that accommodates a circuit substrate;
   a fuse box that detachably accommodates a fuse element, the fuse box being provided at an upper portion of the circuit housing in a state where the electrical connection box being attached to the attachment objective member;
   a plurality of bus bars that connect the circuit substrate and the fuse element; and
   a water-discharge channel that discharges water flowed into the fuse box to outside of the electrical connection box, the water-discharge channel being provided at a lower part of the bus bars in a state where the electrical connection box is attached to the attachment objective member, and at a position between the circuit housing and the fuse box, and being formed from the exterior surfaces of the circuit housing elements.

2. The electrical connection box according to claim 1, wherein the water-discharge channel includes a water-discharge inclined face that is provided on an upper face of the circuit housing, the water-discharge channel being formed to descend toward a side of the circuit housing.

3. The electrical connection box according to claim 2, wherein the water-discharge inclined face is provided with a supporting piece being formed to project from the water-discharge inclined face and supports the fuse box.

4. The electrical connection box according to claim 3, wherein the supporting piece is formed in a tabular shape provided along an inclination direction of the water-discharge inclined face, and
   wherein an upper end face of the supporting piece serves as a support plate portion that abuts a lower surface of the fuse box.

5. The electrical connection box according to claim 1, wherein the circuit housing includes a connector housing that accommodates an end portion of the bus bars, the end portion being provided to be electrically connected with the fuse element.

6. The electrical connection box according to claim 1, wherein the circuit housing includes a water-proof casing that accommodates electrical components provided on the circuit substrate.

7. The electrical connection box according to claim 6, wherein the circuit housing includes a connector hosing that accommodates an end portion of the bus bars, the end portion being provided to be electrically connected with the fuse element.

8. The electrical connection box according to claim 7, wherein the connector housing is provided to be detachable with the water-proof casing.

9. The electrical connection box according to claim 8, wherein connector housing includes an engagement portion that engages with a mating connector that is attached to the end portion of the bus bars, and
   wherein the engagement portion is provided to open downward in a state where the electrical connection box is attached to the attachment objective member.

10. The electrical connection box according to claim 7, wherein the water-discharge channel includes:
   a first water-discharge inclined face that is provided on an upper surface of the water-proof casing, the first water-discharge inclined face being formed to incline to a side of the water-proof casing; and
   a second water-discharge inclined face that is provided on a lower surface of the water-proof casing at a position opposite to the first water-discharge inclined face, and
   wherein the first and the second water-discharge inclined face forms a groove having a sectional shape being narrowed downward in a state where the electrical connection box is attached to the attachment objective member.

11. The electric connection box according to claim 1, wherein the fuse box is provided with a fuse compartment that accommodates the fuse element detachably, the fuse compartment being provided to open upward in a state where the electric connection box is attached to the attachment objective member.

12. The electric connection box according to claim 11, wherein the water-discharge channel discharges water flowed into the fuse compartment to outside of the electrical connection box.

* * * * *